(12) United States Patent
Feng et al.

(10) Patent No.: US 11,777,067 B2
(45) Date of Patent: *Oct. 3, 2023

(54) BEZEL-FREE DISPLAY TILE WITH EDGE-WRAPPED CONDUCTORS AND METHODS OF MANUFACTURE

(71) Applicant: CORNING INCORPORATED, Corning, NY (US)

(72) Inventors: Jiangwei Feng, Painted Post, NY (US); Sean Matthew Garner, Elmira, NY (US); Jen-Chieh Lin, San Jose, CA (US); Robert George Manley, Vestal, NY (US); Timothy James Orsley, San Jose, CA (US); Richard Curwood Peterson, Elmira Heights, NY (US); Michael Lesley Sorensen, Waverly, NY (US); Pei-Lien Tseng, Zhubei (TW); Rajesh Vaddi, Horseheads, NY (US); Lu Zhang, Painted Post, NY (US)

(73) Assignee: Corning Incorporated, Corning, NY (US)

(*) Notice: Subject to any disclaimer, the term of this patent is extended or adjusted under 35 U.S.C. 154(b) by 37 days.

This patent is subject to a terminal disclaimer.

(21) Appl. No.: 17/697,196

(22) Filed: Mar. 17, 2022

(65) Prior Publication Data

US 2022/0209087 A1 Jun. 30, 2022

Related U.S. Application Data

(63) Continuation of application No. 16/756,692, filed as application No. PCT/US2018/056018 on Oct. 16, 2018, now Pat. No. 11,282,994.

(Continued)

(51) Int. Cl.
*H01L 33/62* (2010.01)
*H01L 27/15* (2006.01)

(52) U.S. Cl.
CPC ............ *H01L 33/62* (2013.01); *H01L 27/156* (2013.01); *H01L 2933/0066* (2013.01)

(58) Field of Classification Search
None
See application file for complete search history.

(56) References Cited

U.S. PATENT DOCUMENTS

| 4,183,629 A | 1/1980 | Kazunari et al. |
| 5,973,390 A | 10/1999 | Amaya et al. |

(Continued)

FOREIGN PATENT DOCUMENTS

| CN | 206370418 U | 8/2017 |
| EP | 3343273 A2 | 7/2018 |

(Continued)

OTHER PUBLICATIONS

Garner et al; "Ultra-Slim Flexible Glass for Electronic Applications"; MRS Fall Meeting; vol. 28 (2012) 27 pages.

(Continued)

*Primary Examiner* — Robert K Carpenter
(74) *Attorney, Agent, or Firm* — Ryan T. Hardee; Grant A. Gildehaus

(57) ABSTRACT

Display tiles comprising pixel elements on a first surface of a substrate connected by an electrode, a driver located opposite the first surface, and a connector wrapped around an edge surface of the substrate connecting the driver to the pixel elements. Displays comprised of display tiles and methods of manufacturing display tiles and displays are also disclosed.

22 Claims, 15 Drawing Sheets

Related U.S. Application Data

(60) Provisional application No. 62/572,900, filed on Oct. 16, 2017.

(56) References Cited

U.S. PATENT DOCUMENTS

| | | |
|---|---|---|
| 6,433,995 B2 | 8/2002 | Nakagawa et al. |
| 7,503,769 B2 | 3/2009 | Ohtsuki et al. |
| 7,999,795 B2 | 8/2011 | Hamblin et al. |
| 8,446,386 B2 | 5/2013 | Hamblin et al. |
| 8,878,081 B2 | 11/2014 | Kang et al. |
| 9,063,600 B2 | 6/2015 | Lee |
| 9,207,477 B2 | 12/2015 | Miyazaki et al. |
| 9,288,870 B2 | 3/2016 | Kiryuschev et al. |
| 9,351,400 B1 | 5/2016 | Sung et al. |
| 9,590,292 B2 | 3/2017 | Li et al. |
| 9,642,250 B1 | 5/2017 | Huang et al. |
| 10,020,569 B2 | 7/2018 | Huang et al. |
| 10,108,038 B2 | 10/2018 | Naas et al. |
| 10,468,396 B2 | 11/2019 | Kim et al. |
| 11,282,994 B2 * | 3/2022 | Feng ................ H01L 33/62 |
| 2002/0135727 A1 | 9/2002 | Nakaminami et al. |
| 2003/0137477 A1 | 7/2003 | Dances |
| 2005/0237445 A1 | 10/2005 | Grupp et al. |
| 2011/0275270 A1 * | 11/2011 | Matsuoka ......... G02F 1/136259 |
| | | 345/55 |
| 2011/0292323 A1 | 12/2011 | Corrigan et al. |
| 2012/0190220 A1 | 7/2012 | Lee et al. |
| 2013/0043473 A1 | 2/2013 | Kim et al. |
| 2014/0262466 A1 | 9/2014 | Farkhondeh et al. |
| 2015/0359065 A1 | 12/2015 | Park et al. |
| 2017/0148374 A1 | 5/2017 | Lee et al. |
| 2017/0307922 A1 | 10/2017 | Naas et al. |
| 2017/0309698 A1 | 10/2017 | Bower et al. |
| 2018/0190631 A1 | 7/2018 | Kim et al. |
| 2018/0190747 A1 | 7/2018 | Jeong et al. |
| 2019/0279575 A1 * | 9/2019 | Kim .................... G09G 3/3266 |

FOREIGN PATENT DOCUMENTS

| | | |
|---|---|---|
| JP | 09-068714 A | 3/1997 |
| JP | 2003-248437 A | 9/2003 |
| JP | 2009-008731 A | 1/2009 |
| JP | 2015-175969 A | 10/2015 |
| JP | 2016-206630 A | 12/2016 |
| JP | 2017-528767 A | 9/2017 |
| TW | I581225 B | 5/2017 |
| WO | 2019/079253 A1 | 4/2019 |

OTHER PUBLICATIONS

Naundorf et al; "A Fundamentally New Mechanism for Additive Metallization of Polymeric Substrates in Ultra Fine Line Technology Illustrated for 3D-MIDs"; Sonderdruck Aus Heft NR. 9, Band 92 (2000) 4 pages.

Xing et al; "Two-Photon Polymerization Microfabrication of Hydrogels: An Advanced 3D Printing Technology for Tissue Engineering and Drug Delivery"; Chmeical Society Reviews; 2015, pp. 1-9.

Xu et al; "Flexible Nanowiring of Metal on Nonplanar Substrates by Femtosecond-Laser-Induced Electroless Plating"; Small, 6, No. 16 (2010) pp. 1762-1766.

Taiwanese Patent Application No. 107136168, Office Action, dated Jun. 14, 2022, 1 page; Taiwanese Patent Office.

Garner et al; "Ultra-Slim Flexible Glass for Electronic Applications"; Corning Incorporated; 27 pages; (2013.

European Patent Application No. 18797352 Office Action dated May 23, 2022; 8 Pages; European Patent Office.

Japanese Patent Application No. 2020-542055, Office Action, dated Jun. 6, 2022, 10 pages (5 pages of English Translation and 5 pages of Original Copy); Japanese Patent Office.

* cited by examiner

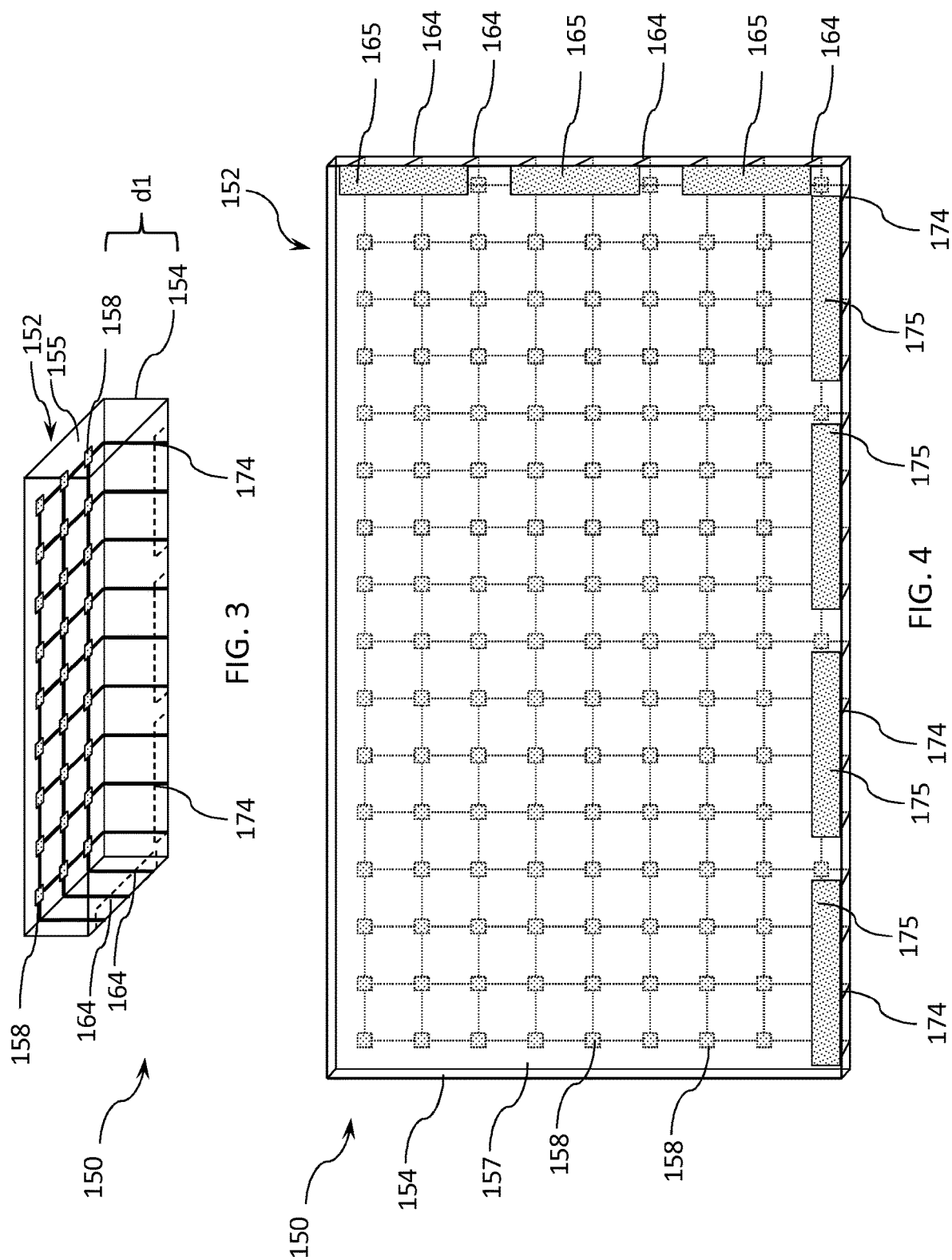

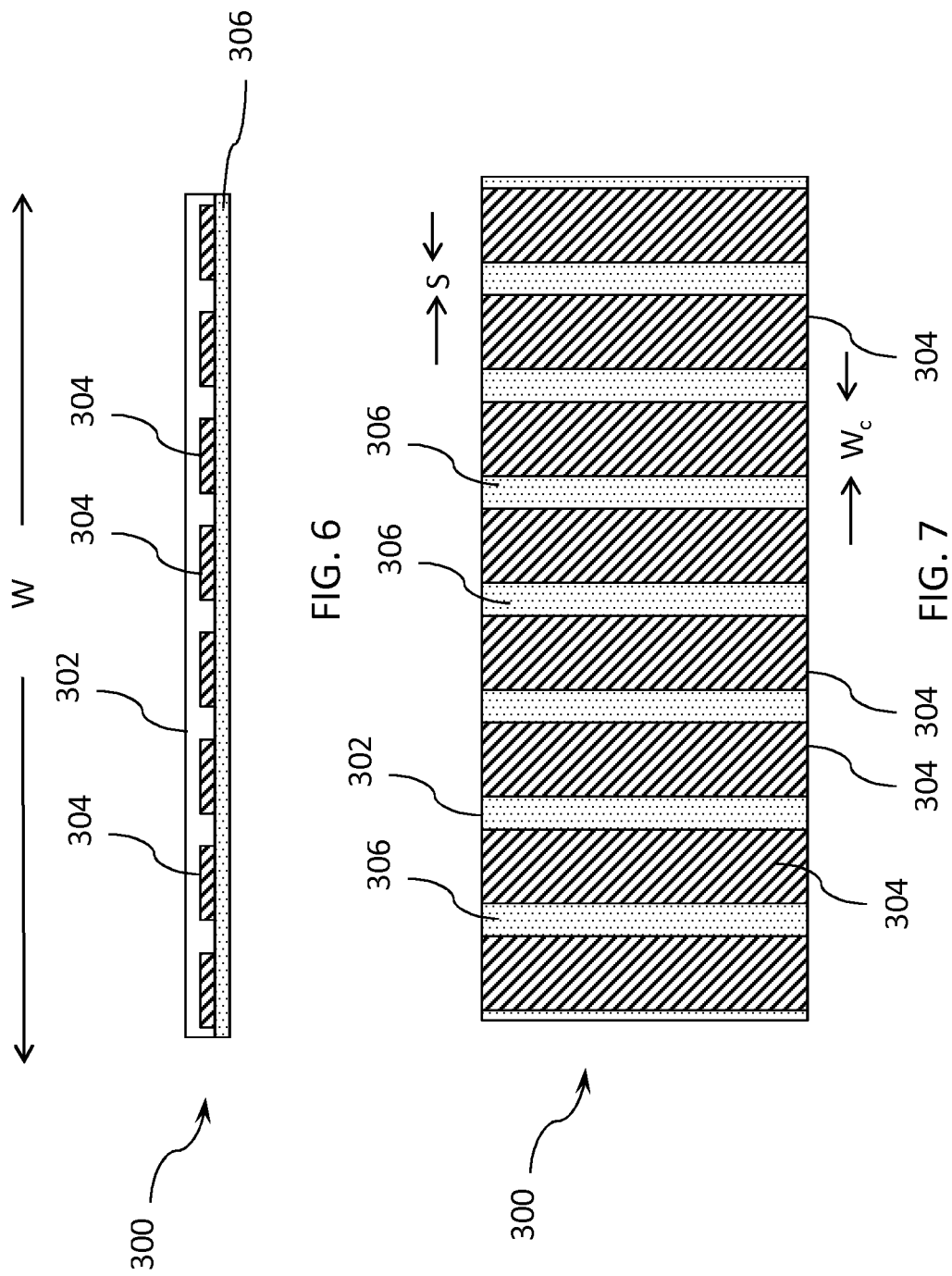

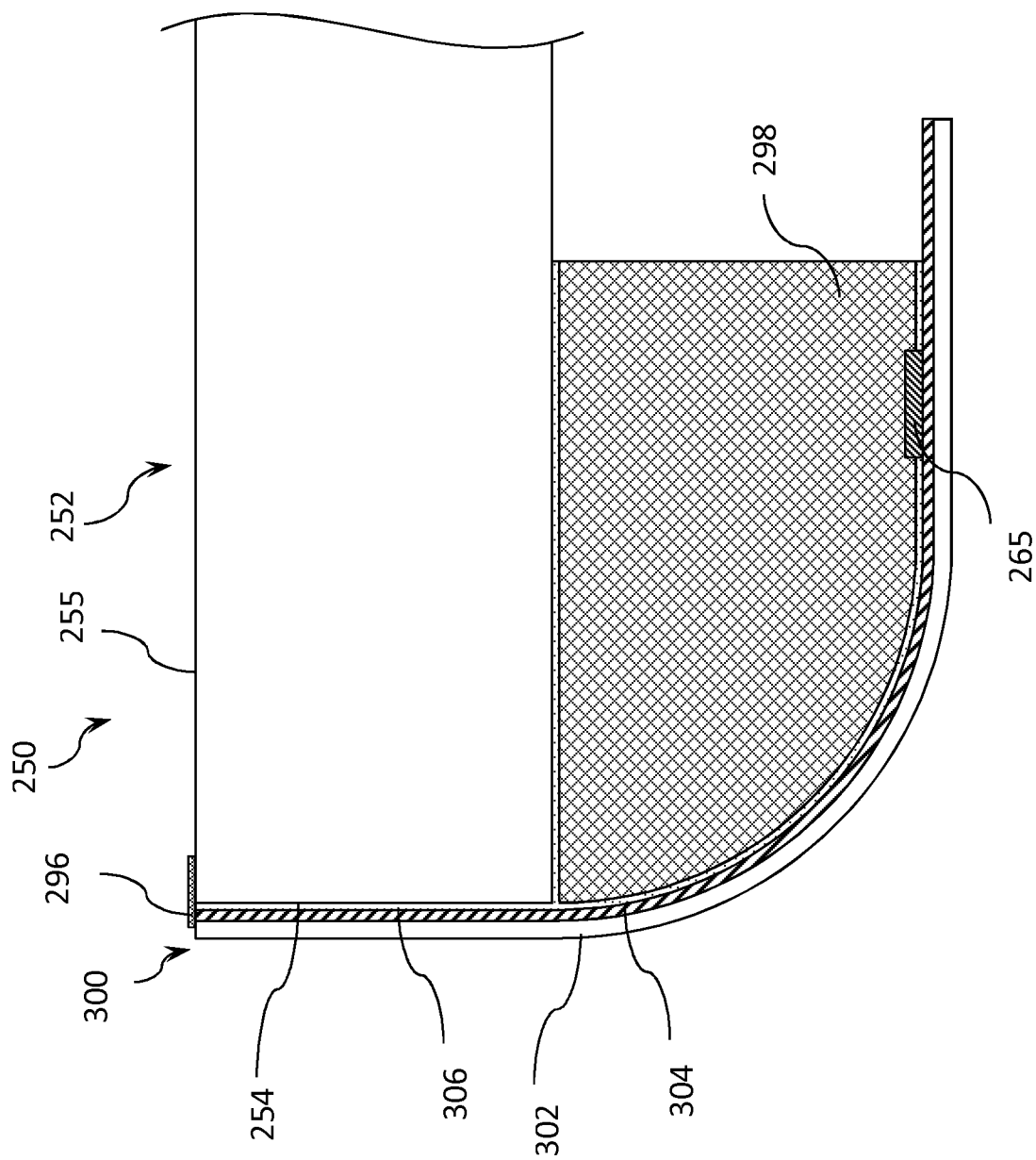

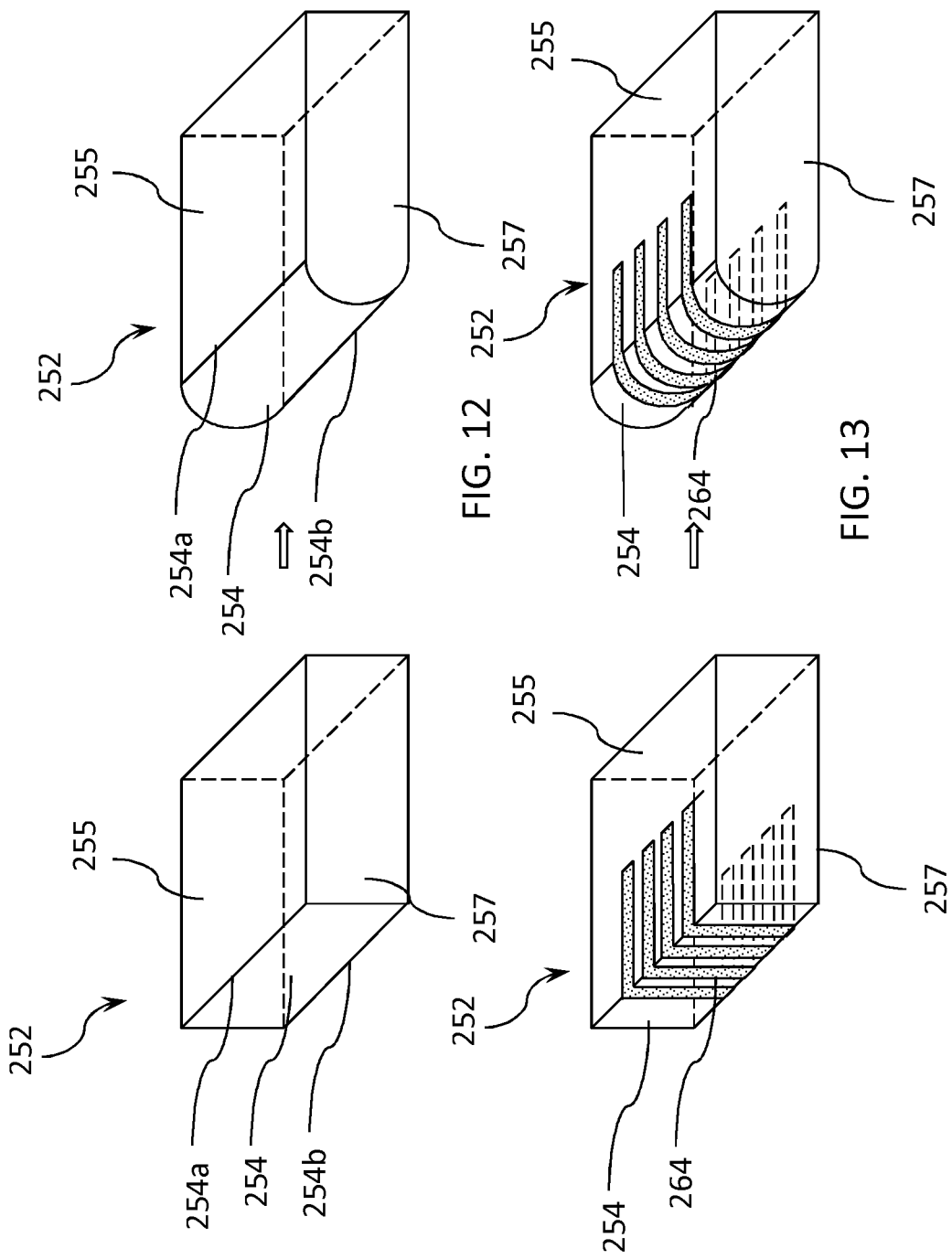

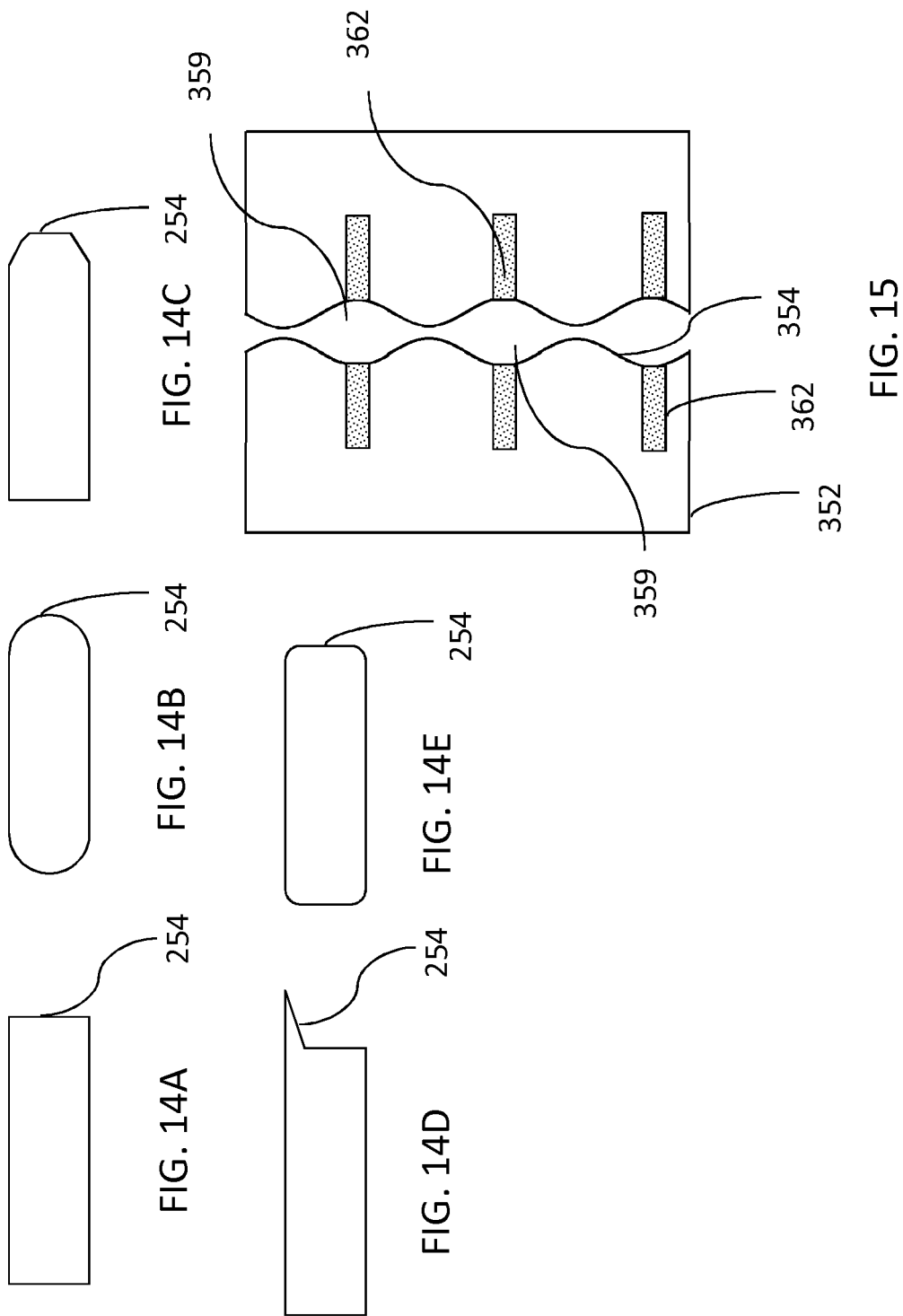

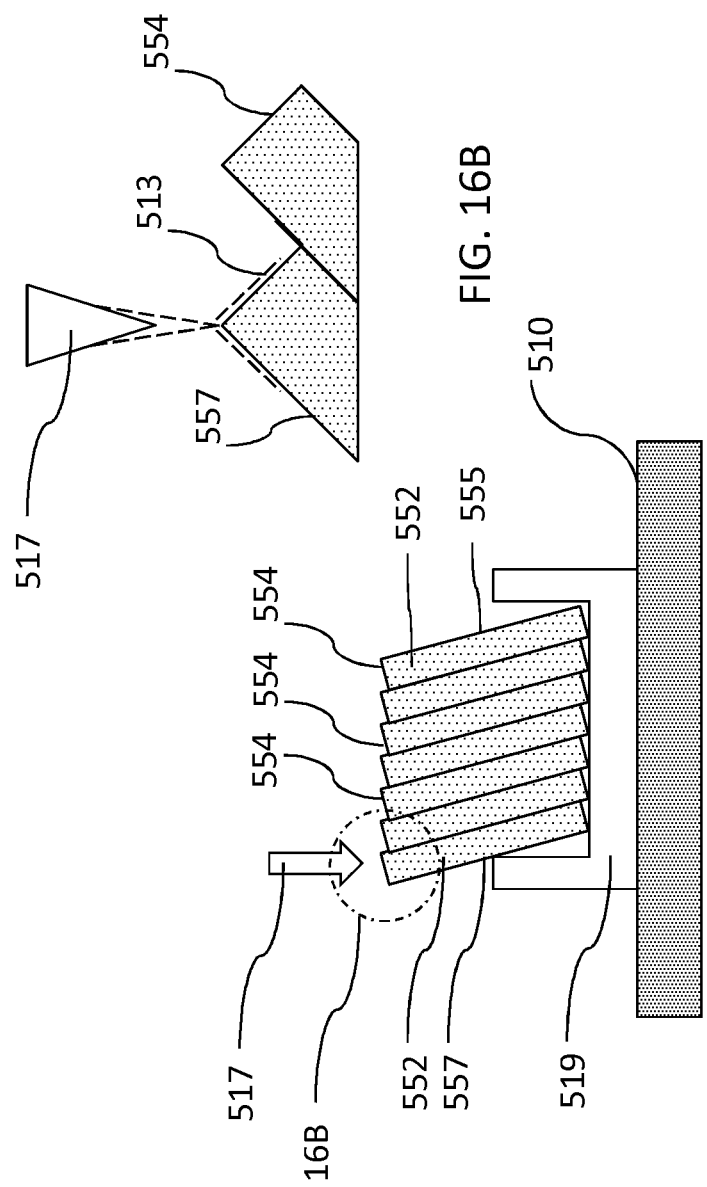

BEZEL-FREE DISPLAY TILE WITH EDGE-WRAPPED CONDUCTORS AND METHODS OF MANUFACTURE

CROSS-REFERENCE TO RELATED APPLICATION

This application is a continuation application and claims the benefit of priority under 35 U.S.C. § 120 of U.S. application Ser. No. 16/756,692 filed on Apr. 16, 2020, which in turn, claims the benefit of priority under 35 U.S.C. § 371 of International Application Serial No. PCT/US2018/056018 filed on Oct. 16, 2018, which in turn, claims the benefit of priority under 35 U.S.C. § 119 of U.S. Provisional Application Ser. No. 62/572,900 filed on Oct. 16, 2017, the contents of which are relied upon and incorporated herein by reference in their entireties.

FIELD OF THE DISCLOSURE

The disclosure relates generally to display devices, and more particularly to bezel-free display tiles comprising an edge-wrapped conductor and methods for manufacturing the same.

BACKGROUND

Displays comprised of a plurality of individual display tiles are used to manufacture large displays, which are sometimes referred to as tiled displays. For example, video walls comprised of multiple display tiles are known for their high-impact engagement and stunning visuals, and are utilized in a variety of settings, including retail environments, control rooms, airports, television studios, auditoriums and stadiums. As will be apparent from FIG. 1, in current displays, the edge portions of the display tiles and the display device itself are utilized for electrical leads and various other electronic components associated with the operation of the display panel, such as driver circuits that can include thin film transistor arrays for an active matrix display. Examples of these displays include liquid crystal displays (LCD) and organic light emitting diode (OLED) displays. This has resulted in flat display panel manufacturers encasing the edge portions within and/or behind a bezel, which conceals the foregoing electronic components.

FIG. 1 shows a prior art display tile 50, which comprises a first substrate 52 having a first surface 55 and an outer perimeter 56. The display tile 50 includes rows 60 of pixel elements, each row 60 of pixel elements 58 connected by a row electrode 62 and a plurality of columns 70 of pixel elements 58, each column 70 of pixel elements 58 connected by a column electrode 72. The display tile further includes at least one row driver 65 that activates the rows 60 of pixel elements 58 and at least one column driver 75 that activates the columns 70 of pixel elements 58. In the prior art display tile 50, the row drivers 65 and the column drivers 75 are located on the first surface 55 on the same side of the pixel elements, requiring a bezel (not shown) to cover the row drivers 65 and the column drivers 75.

For aesthetic reasons, flat panel display makers are trying to maximize the image viewing area and provide a more aesthetically pleasing appearance by minimizing the size of the bezel surrounding the image on the display. However, there are practical limits to this minimization, and current bezel sizes are on the order of 3 millimeters to 10 millimeters in width.

There have been efforts in the industry to achieve tiled displays comprised of display tiles with no bezel and seamless zero millimeter bezel (referred to herein as "zero bezel" or "bezel-free"). Bezel-free display tiles allow for vast configurations of tiled displays without the need for irritating black gaps. To achieve a bezel-free display tile, it can be advantageous to have the pixel elements in close proximity to the edges of the display tiles. These pixel elements can be located on the front side of the display tile substrate and the control electronics on the back side. As a result, there is a need to electrically interconnect the front and back sides of the display tile substrate.

One way to achieve such interconnects in a display tile substrate made from glass is with metallized through glass vias ("TGVs"). Such TGVs can be used to manufacture a zero bezel microLED display, however, TGVs are fairly expensive to make, at least using current methods which involve laser damage of each hole (a serial process) followed by etch. The holes then need to be further processed for metallization.

Implementation of TGVs presents challenges with overall manufacturing process sequence. If the front of the tile substrate is to have a thin film transistor (TFT) array, a question arises as to when the glass vias are made and metallized. Since TFT array fabrication is traditionally done on a pristine glass surface, etching and metallization may best be done after TFT fabrication. As a result, the array must be protected from etch and also be compatible with the metallization technique.

There is a continuing need to provide efficient and effective interconnects on display tiles. It would be desirable to provide bezel-free display tiles that could be placed in an array to achieve a large display that maintains pixel pitch across tile boundaries of adjacent display tiles without metallized vias.

SUMMARY

A first aspect of the disclosure pertains to a display tile comprising a first substrate comprising a first surface, a second surface opposite the first surface and an edge surface between the first surface and the second surface, the edge surface defining an outer perimeter; the first surface comprising an array of pixel elements arranged in a plurality of rows of pixel elements and a plurality of columns of pixel elements, each row of pixel elements connected by a row electrode and each column of pixel elements connected by a column electrode; a row driver that activates the rows of pixel elements and a column driver that activates the columns of pixel elements, the row and the column drivers located opposite the first surface; a plurality of row electrode connectors, each row electrode connector wrapped around the edge surface and electrically connecting a row electrode, a row of pixel elements and the row driver; and a plurality of column electrode connectors, each column electrode connector wrapped around the edge surface and electrically connecting a column electrode, a columns of pixel elements and the column driver.

A second aspect of the disclosure pertains to a method of manufacturing a display tile, the method comprising placing at least one driver on a first substrate having pixel elements on a first surface of the first substrate, the driver placed on a second surface opposite the first surface and that can activate the pixel elements; and placing a connector on an edge surface and extending to the first surface and the second surface, the edge surface defining an outer perimeter.

A third aspect of the disclosure pertains to a method of manufacturing a display, comprising placing display tiles described herein in close proximity to each other at respective edge surfaces of the display tiles.

A fourth aspect of the disclosure pertains to a method of manufacturing a plurality of display tiles comprising stacking a plurality of substrates to provide a stack, each of the plurality of substrates having a first surface, a second surface opposite the first surface and an edge surface between the first surface and the second surface, the edge surface defining an outer perimeter; arranging the stack at an angle with respect to a horizontal surface to expose the edge surface; depositing conductive material on the edge surface, the first surface and the second surface to form a plurality of row electrode connectors and a plurality of column electrode connectors; electrically connecting an array of pixel elements arranged in a plurality of rows of pixel elements and a plurality of columns of pixel elements so that there are individual rows of pixel elements on the first surface of each of the plurality of substrates, the individual rows of pixel elements connected with individual row electrodes and individual row electrode connectors; electrically connecting individual columns of pixel elements on the first surface of each of the plurality of substrates with individual column electrodes and individual column electrode connectors; and placing at least one driver on a second surface opposite the first surface of each of the plurality of substrates, wherein the driver can activate the pixel elements.

BRIEF DESCRIPTION OF THE DRAWINGS

The following detailed description can be further understood when read in conjunction with the following drawings.

FIG. 3 is a side perspective view of the display tile of FIG. 2;

FIG. 4 is a bottom perspective view of the display tile of FIG. 2;

FIG. 6 is an end view of a flex circuit according to one or more embodiments of the disclosure;

FIG. 7 is a top plan view of the flex circuit of FIG. 6;

FIG. 11 is a partial side view of a flex circuit adhered to a substrate and a driver disposed on an end of the flex circuit wrapped around a standoff according to one or more embodiments of the disclosure;

FIG. 12 shows a substrate that can be used for a display tile that has been processed to have a rounded edge surface according to one or more embodiments of the disclosure;

FIG. 13 shows a connector applied to a substrate having a square edge surface and a substrate having a round edge surface according to one or more embodiments of the disclosure;

FIGS. 14A-E show various edge surface profiles of display tiles according to one or more embodiments of the disclosure;

FIG. 15 shows two display tiles having their edges in close proximity according to one or more embodiments of the disclosure;

FIG. 16A is a side view showing a sample holder for processing substrates to make a plurality of display tiles according to one or more embodiments of the disclosure;

FIG. 16B is an enlarged section from FIG. 16A;

DETAILED DESCRIPTION

Figure 1:
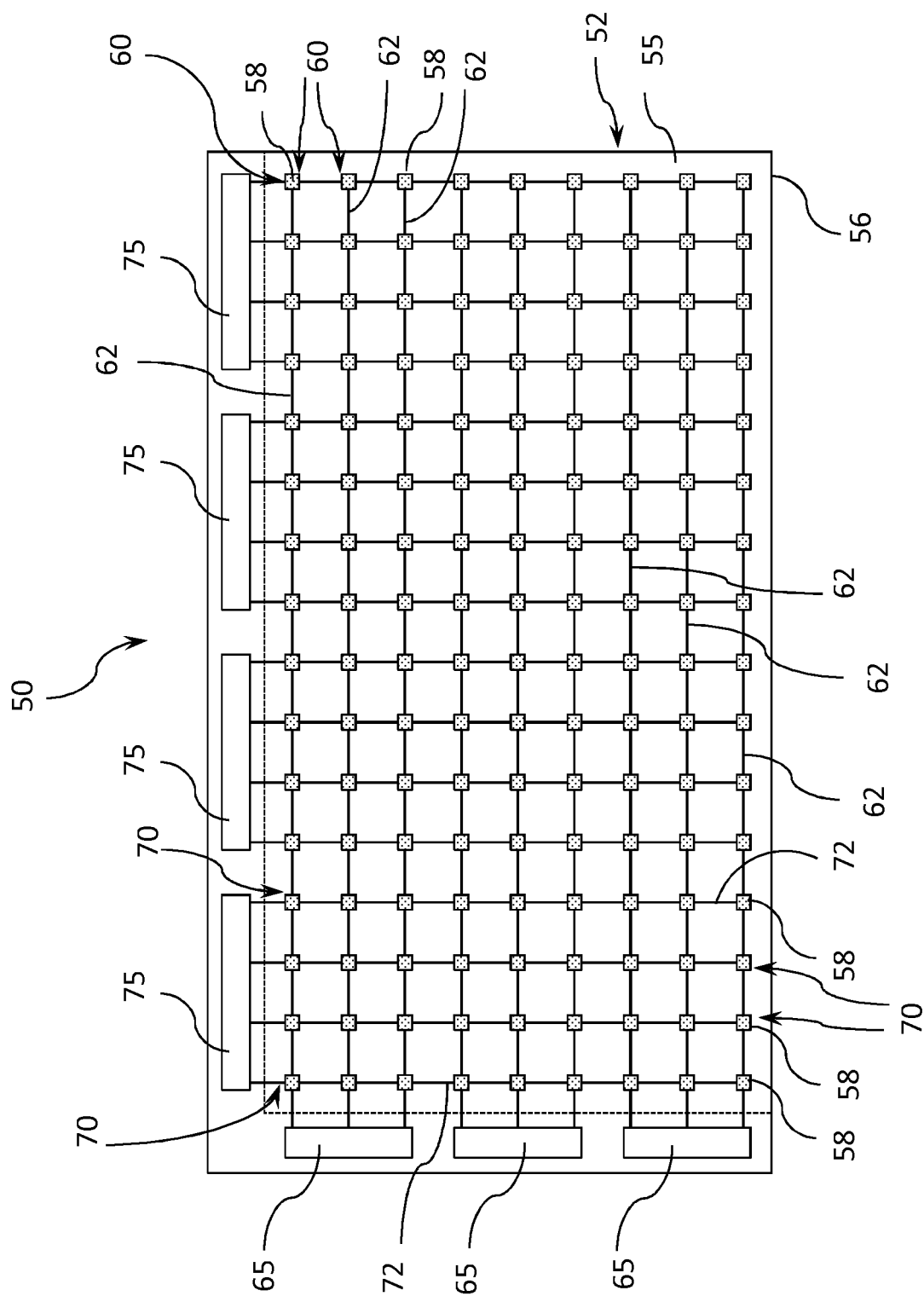
FIG. 1 is a schematic top perspective view of a prior art display.

Described herein are display tiles, methods of manufacturing display tiles, tiled displays comprising display tiles and methods of manufacturing tiled displays utilizing the display tiles described herein. As used herein, the terms "display" and "display device" are intended to encompass all devices capable of displaying visual content, including, but not limited, to computers, including laptops, notebooks, tablets and desktops, mobile telephones, wearable displays such as watches, televisions (TV) and video displays comprised of multiple display tiles such as video walls and stadium display screens. Each of the foregoing devices includes many component parts including the physical case or cabinet in which individual components may reside, circuit boards, circuit elements such as integrated electronic components, and of course the display panel itself.

Currently, these display panels are flat display panels comprising liquid crystal display elements, organic light emitting diode (OLED) display elements, plasma display elements, or micro-LED display elements, and of course the glass or plastic substrates that many of these elements are disposed on and/or enclosed by. Micro-LED, also known as microLED or mLED, is an emerging flat panel display technology. Micro-LED displays have arrays of microscopic LEDs that are part of the individual pixel elements. Compared to LCD technology, micro-LED displays offer greater contrast, much faster response times, and use less energy. The fabrication of micro-LED displays typically involves mass transfer of micro-LEDs (<100 micrometers in width and length) onto a substrate with patterned circuit (driving with passive matrix format) or transistors (driving with active matrix format), depending on the design and products. Thus, as used herein, the display tiles and displays or display devices described herein can be used in liquid crystal displays, LED displays, OLED displays, plasma displays, and micro-LED displays.

Furthermore, the display tiles and tiled displays described herein can be utilized with both passive matrix (i.e., no TFT array) and active matrix (TFT array) regardless of the particular type of pixel element used to form the display. As is understood in the art, the different types of displays utilize different types of pixel elements to provide the display. For example, in an OLED display, the pixel element comprises rows and columns of "emitters" and TFTs connected by row and column drivers that activate the pixel elements, while with LCD displays, the pixel element comprises rows and columns of liquid crystal (LC) light valves and transistors connected by row and column drivers that activate the pixel elements. The descriptions provided herein are simplified such that each pixel element comprises one color pixel (e.g., blue), whereas in reality each pixel element is comprised of one or more subpixels (e.g., red, green and blue). The individual pixel elements can be addressed by a unique row/column combination utilizing known technology. The pixel elements are the components required for the functioning of individual pixels in the display and can include emitting elements or light valves and TFTs.

Figure 2:
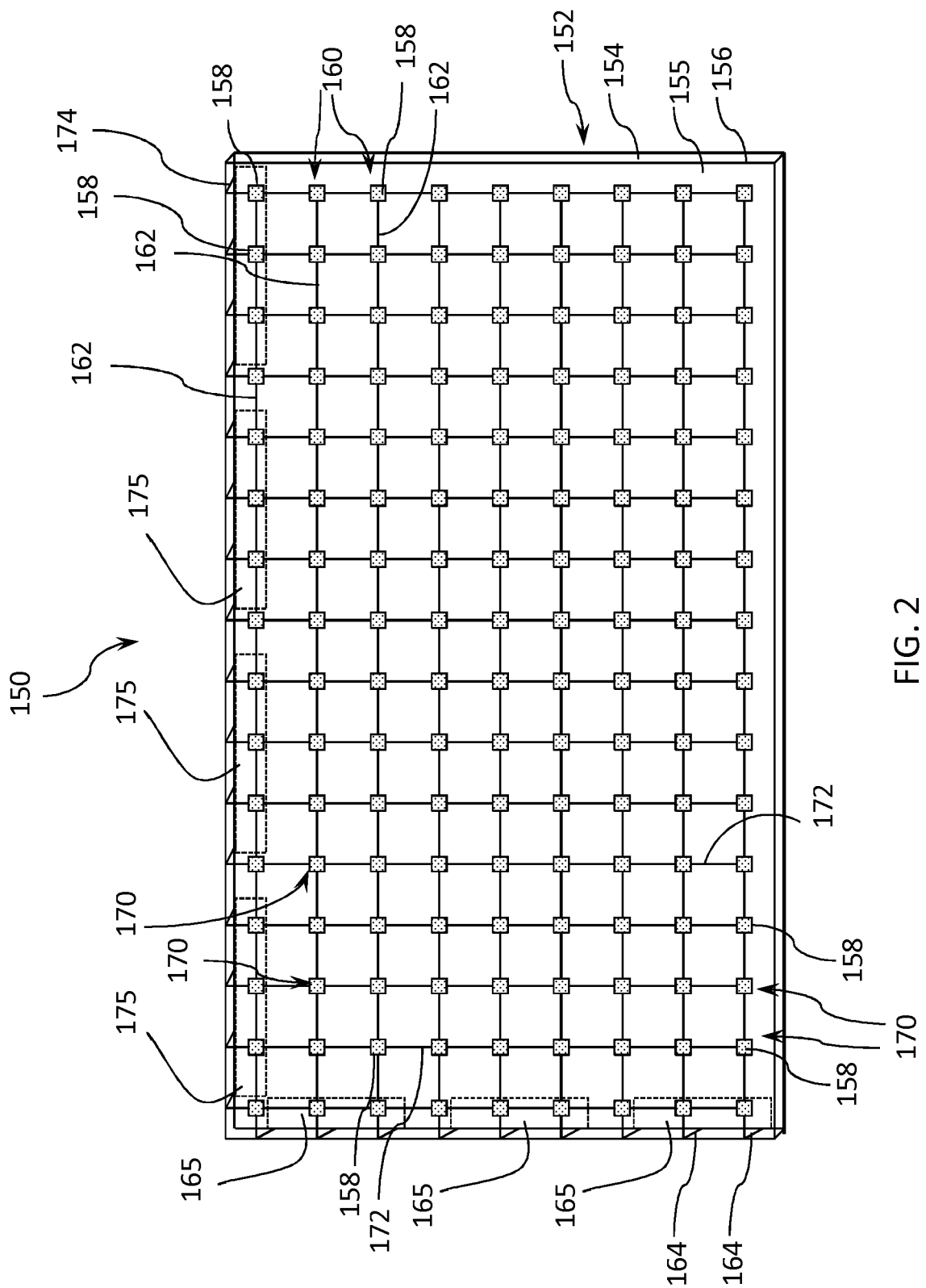
FIG. 2 is a top perspective view of a display tile according to one or more embodiments of the disclosure.

Referring now to FIGS. 2-4, a display tile 150 is shown, which comprises a first substrate 152 comprising a first surface 155, a second surface 157 opposite the first surface 155 and an edge surface 154 between the first surface 155 and the second surface 157, the edge surface 154 defining an outer perimeter 156 of the display tile.

The display tiles 150 described herein according to one or more embodiments can comprise a substrate 152 of any suitable material, for example, a polymeric substrate or a glass-based substrate having any desired size and/or shape appropriate to produce a display tile. The first surface 155 and second surface 157 may, in certain embodiments, be planar or substantially planar, e.g., substantially flat. The first surface 155 and the second surface 157 may, in various embodiments, be parallel or substantially parallel. The substrate 152 according to some embodiments may comprise four edges as illustrated in FIGS. 2-4, or may comprise more than four edges, e.g. a multi-sided polygon. In other embodiments, the display tile 150 may comprise less than four edges, e.g., a triangle. By way of a non-limiting example, the substrate 152 may comprise a rectangular, square, or rhomboid sheet having four edges, although other shapes and configurations are intended to fall within the scope of the disclosure including those having one or more curvilinear portions or edges.

In certain embodiments, substrate 152 may have a thickness d1 of less than or equal to about 3 mm, for example, ranging from about 0.1 mm to about 3 mm, from about 0.1 mm to about 2.5 mm, from about 0.3 mm to about 2 mm, from about 0.3 mm to about 1.5 mm, from about 0.3 mm to about 1 mm, from about 0.3 mm to about 0.7 mm, or from about 0.3 mm to about 0.5 mm, including all ranges and subranges therebetween.

As used herein, the term "glass-based substrates" is used in the broadest sense to include any object made wholly or partly of glass. Glass-based substrates include laminates of glass and non-glass materials, laminates of glass and crystalline materials, and glass-ceramics (including an amorphous phase and a crystalline phase). Unless otherwise specified, all glass compositions are expressed in terms of mole percent (mol %).

The glass-based substrate used to manufacture the display tile can comprise any glass-based material known in the art for use in display devices. For example, the glass-based substrate may comprise aluminosilicate, alkali-aluminosilicate, borosilicate, alkali-borosilicate, aluminoborosilicate, alkali-aluminoborosilicate, soda lime, or other suitable glasses. Non-limiting examples of commercially available glasses suitable for use as a glass substrate include, for example, EAGLE XG®, Lotus™, and Willow® glasses from Corning Incorporated.

The first surface 155 of the display tile 150 comprises an array of pixel elements 158 arranged in a plurality of rows 160 of pixel elements 158 and a plurality of columns 170 of pixel elements 158. Each row 160 of pixel elements 158 is connected by a row electrode 162, and each column 170 of pixel elements 158 is connected by a column electrode 172. It will be understood, that the rows 160 and columns 170 of pixel elements that intersect include some of the same pixel elements 158. Thus, there are not two separate sets of pixel elements 158, but one array of pixel elements 158 containing pixel elements 158 that are both connected to separate row and column electrodes. The display tile according to one or more embodiments comprises at least one row driver 165 that electrically activates the rows 160 of pixel elements 158 and at least one column driver 175 that activates the columns 170 of pixel elements 158, the row drivers 165 and the column drivers 175 are located opposite the first surface 155. In the embodiment shown in FIGS. 2-4, the row drivers 165 and the column drivers 175 are located on the second surface 157 of the substrate 152. In other embodiments, the row drivers 165 and the column drivers 175 can be located on a separate structure disposed opposite the first surface 155, such as on a separate substrate (not shown) or other suitable structure.

As will be appreciated, the row drivers 165 and the column drivers 175 must be connected to the row electrodes 162 and the column electrodes 172 to activate the pixel elements 158. A plurality of row electrode connectors 164 are provided, and each row electrode connector 164 is wrapped around the edge surface 154 and electrically connects a row electrode 162, a row 160 of pixel elements 158 and a row driver 165. The display tile shown further comprises a plurality of column electrode connectors 174, each column electrode connector 174 wrapped around the edge surface 154 and electrically connecting a column electrode 172, a column 170 of pixel elements 158 and the column driver 175. In the embodiment shown, each row driver 165 is shown as connecting three rows 160 of row electrodes to pixel elements 158, and each column driver is shown as connecting four columns 170 of column electrodes 172 to pixel elements 158. It will be understood that this arrangement is for illustration purposes only, and the disclosure is not limited to any particular number of row drivers, column drivers or number of row electrode or column electrodes respectively driven by the row drivers and column drivers. For example, the electrode connectors can exist on only one or multiple edge surfaces 154 based on the specific display design and layout. Furthermore, the disclosure is not limited to any particular number of pixel elements 158 or arrangement of pixel elements 158 on the first surface 155 of the substrate 152.

The display tile 150 is free of a bezel around the outer perimeter 156 of the display tile 150, and as such, provides a bezel-free display tile 150 or a zero bezel display tile 150. To achieve a seamless display where the pixel pitch across the tile-to-tile seam is approximately matched to that within the tile, the pixel elements are ≤10 mm, ≤5 mm, ≤3 mm, ≤1 mm, 0.5 mm, or ≤0.3 mm from the edge of the display tile substrate. The pixel elements on neighboring tiles are then registered to each other with placement error ≤50%, ≤30%, ≤10%, ≤5% of a pixel pitch.

Any suitable connector type can be utilized to provide the row electrode connectors 164 and the column electrode connectors 174. Also, all of the electrode connectors do not need to be of the same type or design. In one or more embodiments, at least one row electrode connector 164 and at least one column electrode connector 174 comprises a flex circuit 300 as shown in FIGS. 6 and 7. An exemplary flex circuit 300 comprises a flexible polymeric film 302 and a conductor 304. In the embodiment shown, a plurality of conductors 304 are shown arranged in rows. The flex circuit 300 may further comprise an adhesive 306 that adheres the flex circuit 300 to the edge surface 154 of the substrate 152. In the embodiment shown, the adhesive 306 is an adhesive layer that is integrally formed with the flex circuit. In some embodiments, the flex circuit 300 may comprise the flexible polymeric film 302 and the conductor(s) 304, and an adhesive may be separately applied. The flex circuit 300 has a total thickness in a range of 10 micrometers to 150 micrometers, for example, in a range of 10 micrometers to 50 micrometers or in a range of 10 micrometers to 20 micrometers. Suitable materials for the polymeric film 302 include, but are not limited to materials selected from the group consisting of polyimide, polyester, polyethylene naphthalate (PEN), polyethylene terephthalate (PET), and polyether ether ketone (PEEK). The adhesive 306 can comprise a pressure sensitive adhesive, for example, a pressure sensitive adhesive comprising a material selected from the group consisting of a polyimide, an acrylic, an acrylate, ethylene vinyl acetate, butyl rubber, nitrile, and silicone. The flex circuit 300 can also be adhered to the edge surface 154 by use of a curable or liquid adhesive. The conductor 304 can be selected from copper and silver, other metals or other conductive material capable of forming individual electrode traces, and can be formed by any suitable method such as deposition, plating, printing, thick films, etc. Examples of conductive materials not based on deposited films include Ag ink, CNT, and other solution-based materials. The overall dimension of the flex circuit can vary, and ultimately will be determined by the size of the display tile. A suitable width "W" can be from 10 mm to 500 mm, for example 50-100 mm, and the conductors can have a width "$W_c$" in the range between 20 micrometers and 500 micrometers wide, for example 100 micrometers. Spacing "S" between each conductor ranging from 10 micrometers to 500 micrometers, for example 50 micrometers.

Figure 8:
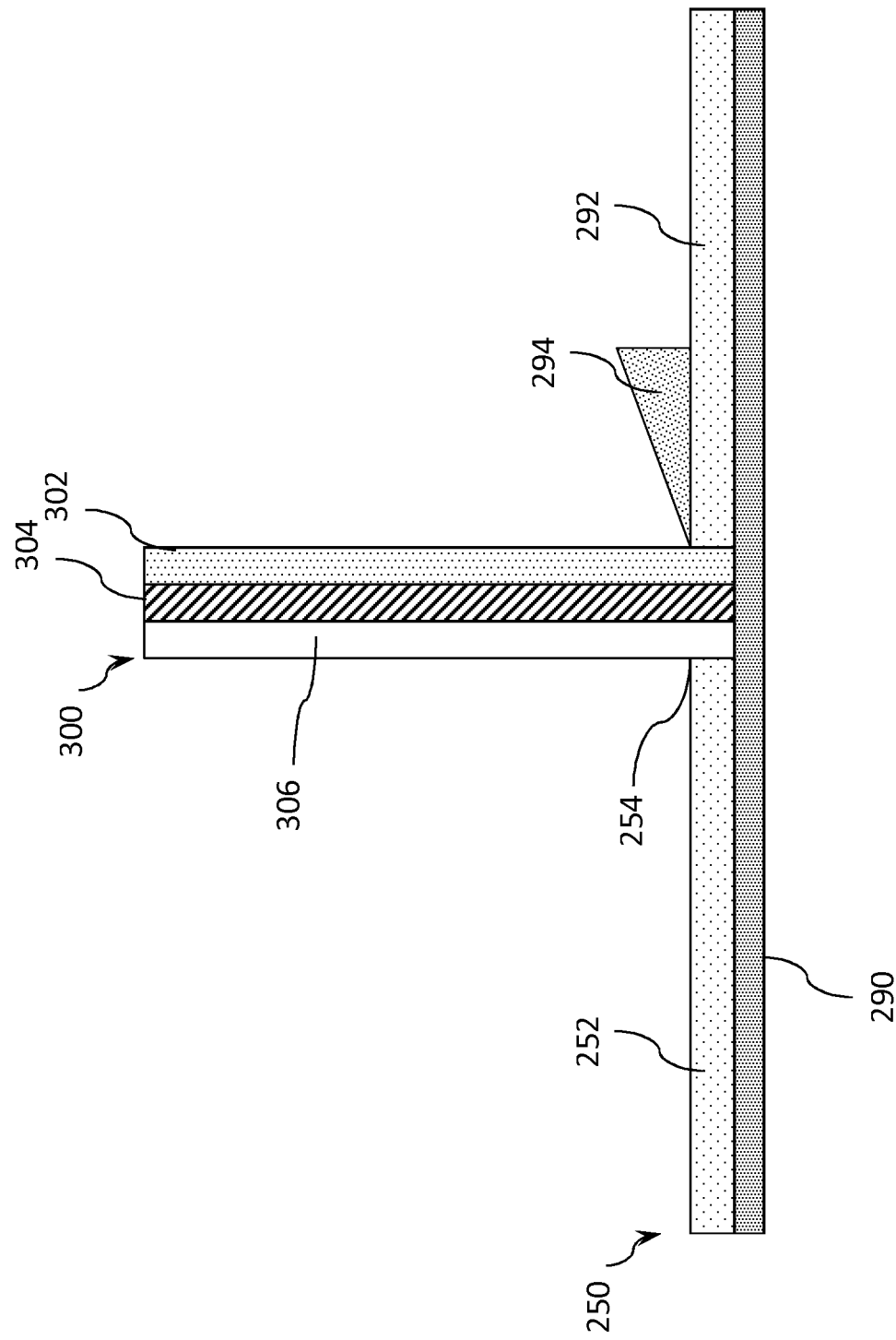
FIG. 8 is a side view showing a flex circuit being applied to a display tile according to one or more embodiments of the disclosure.

FIG. 8 shows a display tile 250 comprising a substrate 252 on a table 290 and a flex circuit 300 including an adhesive 306, a conductor 304 and a polymeric film 302 being applied to and edge surface 254 of the display tile 250. An applicator 292, which can be in the form of a slab of material such as a substrate, which can be a glass substrate or other suitable material presses the flex circuit against the edge surface 254 to adhere the flex circuit 300 to the substrate 252. A cutting device 294, such as a razor, knife, laser or other suitable cutting instrument can cut the flex circuit 300 to an appropriate height, which may be equal to the thickness of the substrate 252, or greater than the thickness of the substrate 252. Electrodes and electrode connectors can be on individual substrates or on multiple substrates at one time. For example, multiple substrates can be stacked together with or without interleaf or spacer materials or other methods of providing a spatial gap between substrates. The electrodes can then be manufactured across the entire stacked edge face at the same time. Different processes can be used to align the stack of edge faces, and different electrode forming methods will have different edge alignment tolerances. After forming the electrode across multiple substrates, the substrates can be separated which may require cutting the electrode material that bridges across each substrate face.

Figure 9:
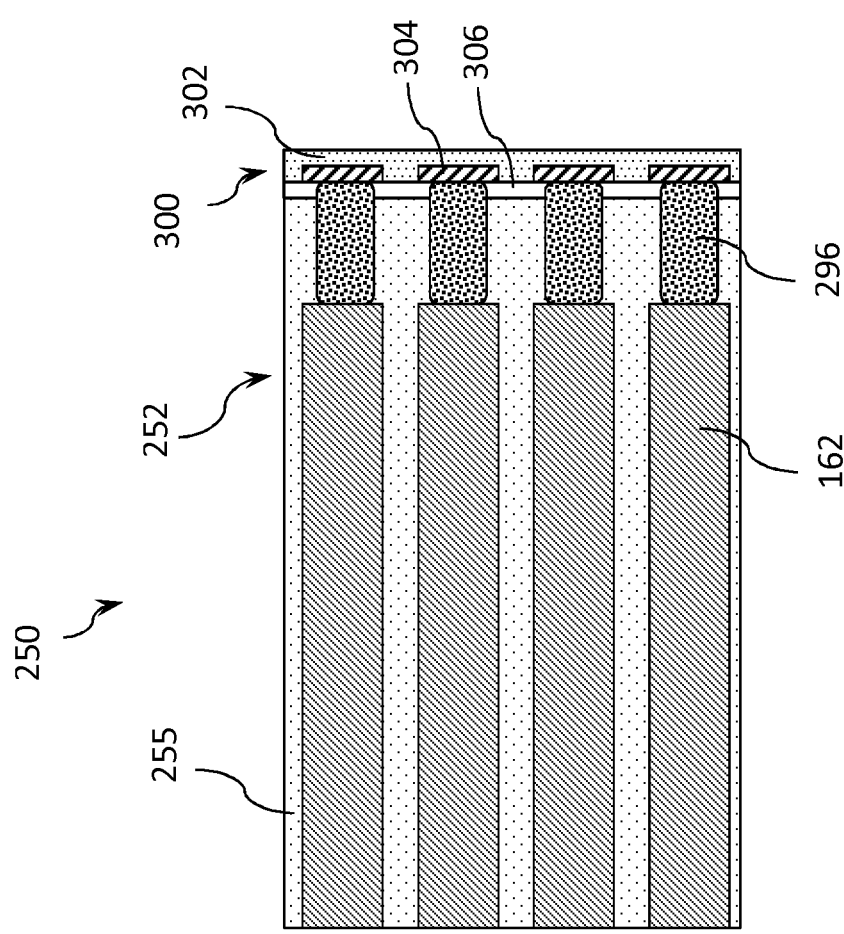
FIG. 9 is a top plan view showing conductive coating making electrical contact with electrodes and a flex circuit on a display tile according to one or more embodiments of the disclosure.

The display tile shown in FIGS. 2-4 shows the row electrode connectors 164 directly connected to the row electrodes 162 and the column electrode connectors 174 directly connected to the column electrodes 172. In some embodiments, each row electrode 162 can be electrically connected to a row electrode connector 164 such as a flex circuit 300 by a conductive coating 296 on the first surface 255 and each column electrode 172 can electrically connected to a column electrode connector 174 such as a flex circuit 300 by a conductive coating 296 on the first surface 255 as shown in FIG. 9, which shows only connection of row electrodes 162 to flex circuits. Similarly, the electrode connector can be connected to electrical structures on the second surface by use of a similar conductive coating. As examples, the conductive coating can be formed by solution-processing, printing, lamination, or vacuum deposition methods. While not shown in FIG. 9, the conductive coating 296 will typically overlap with the row electrode 162 and the flex conductor 304.

Figure 10:
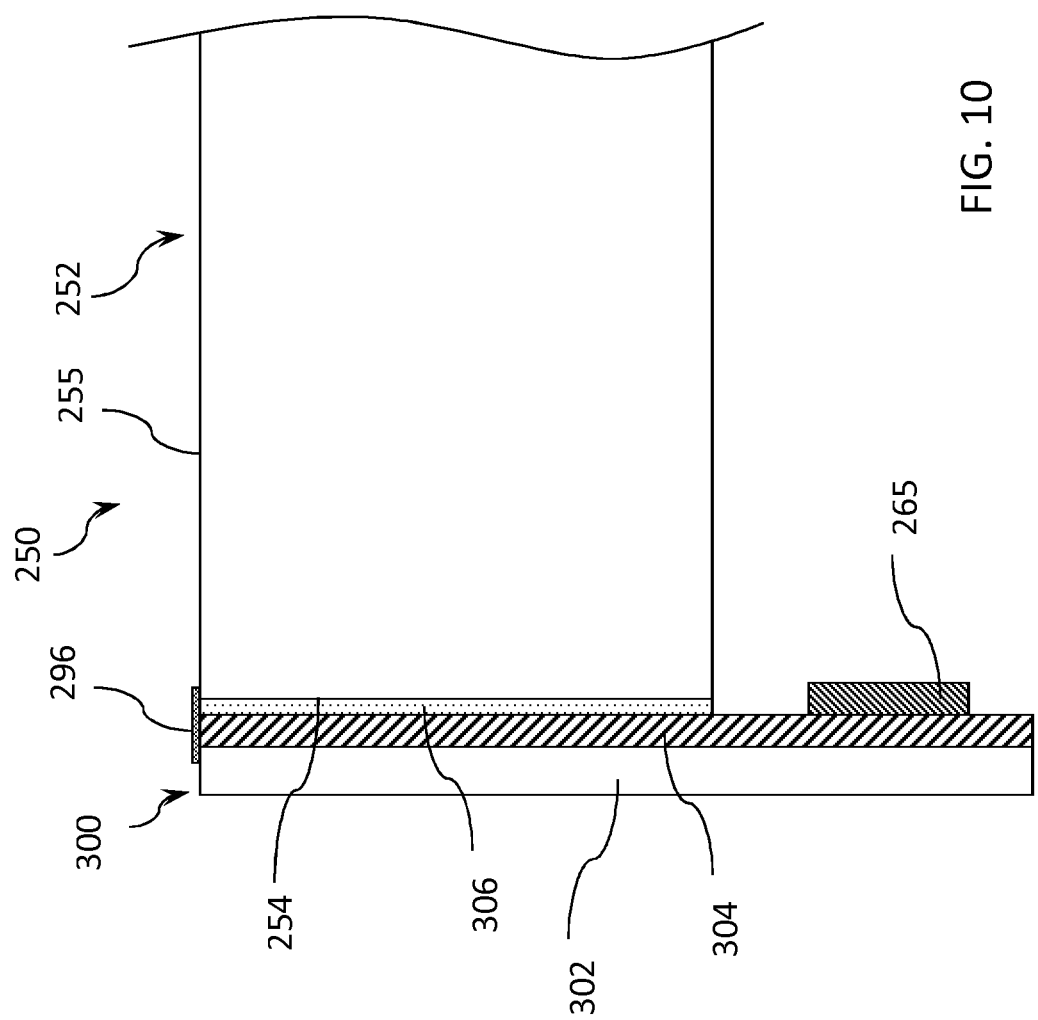
FIG. 10 is a partial side view of a flex circuit adhered to a substrate and a driver disposed on an end of the flex circuit according to one or more embodiments of the disclosure.

Referring now to FIGS. 10 and 11, an embodiment is shown in which a flex circuit 300 is attached to an edge surface 254 of a substrate 252 of a display tile 250 by adhesive 306, and including the conductor 304 and polymeric film 302. The conductive coating 296 on the first surface 255 of the substrate 252 connects the flex circuit 300 to a row electrode (not shown in FIG. 10). A row driver 265 is disposed opposite the first surface 255 and is disposed on the flex circuit 300. FIG. 11 is a configuration similar to FIG. 10 is shown, except there is a second substrate in the form of standoff 298 opposite the first substrate 252 disposed opposite the first surface 255. The second substrate can be in the form of a standoff 298, which may be made of a material such as rubber or a polymer and provides a curved surface for the flex circuit to transition from the edge. In one or more embodiments, there is at least one standoff 298 for column drivers along a long edge surface 254 of the substrate 252 and at least one standoff 298 for row drivers along a short edge. In some embodiments, there is a standoff 298 on all four edge surfaces 254 of the substrate, for example, in a situation where there is a desire was to cut the length of rows and columns by half (i.e., running from each edge to the middle rather than all the way across the substrate 252). In the embodiment shown in FIG. 11, the row driver is sandwiched between the flex circuit 300 and the standoff 298, and disposed on both the flex circuit and the standoff 298. In some embodiments, the driver 265 can be soldered to the flex circuit 300, and the flex circuit 300 can be bonded to the standoff 298 with an adhesive.

Referring now to FIGS. 12 and 13, the display tile substrate 252 can be shaped so that the corner 254a between the first surface 255 and the edge surface 254 and corner 254b between the second surface 257 and the edge surface 254 are such that the first corner 254a and the second corner 254b do not include a 90 degree angle or an undercut angle. As shown in FIG. 12, the edge surface 254 comprises a curved cross-section. FIG. 13 shows the unprocessed substrate 252 with row electrode connectors 264 wrapped around the edge surface 254 to the first surface 255 and the second surface 257. On the left hand side of FIGS. 12 and 13, the corners 254a and 254b are square or comprise 90 degree angles, while the substrates on the right hand side after processing have an edge surface 254 that comprises a curved cross-section. As examples, it is possible to have one corner 254a shaped to be non-90 degree or non-undercut. It is also possible to have both corners 254a and 254b shaped. If both corners are shaped, 254a and 254b do not need to have the same profile.

FIGS. 14A-E show various configurations of edge surfaces 254 that can be utilized in one or more embodiments, with FIG. 14A showing a square edge surface 254 comprising 90 degree angles, FIG. 14B showing a curved cross-section or rounded edge surface 254, FIG. 14C showing a polygonal cross section of edge surface 254 with no 90 degree angles, FIG. 14D showing an edge surface 254 comprising an angle less than 90 degrees, and FIG. 14E showing a slightly rounded edge surface 254. If the edge profile is rounded, the radius is in the range of 1-500 micrometers, 1-200 micrometers, 1-100 micrometers, 1-50 micrometers, 1-20 micrometers, or 1-10 micrometers. The various edge surfaces can be formed using forming techniques such as etching to have an edge surface that comprises an etched surface. The substrate edge surface can be any arbitrary shape that enables continuous electrode manufacture or adhesion. According to one or more embodiments, the edge shaping will be contained within ≤200 um, ≤100 um, ≤50 um, ≤20 um, ≤10 um, ≤5 um from the substrate edge along the first surface. In one or more embodiments, edge shapes include corners between the first/second surface and the edge surface with a curved cross-section having a radius of ≤200 um, ≤100 um, ≤50 um, ≤20 um, ≤10 um, ≤5 um. The various edge surfaces can be used with printed electrodes and/or connectors, patterned electrodes and/or connectors and/or flex circuit connectors. Where a flex circuit is used as a connector, the edge of the flex circuit may be within a distance of ≤100 um, ≤50 um, ≤20 um, ≤10 um, ≤5 um, ≤1 um from the substrate first or second surface.

The profile does not need to be symmetrical, and the edge profile along the perimeter of the substrate at the edge surface does not need to be the same. The edge surface 254 can be formed by edge grinding using a grinding wheel to provide an edge surface that comprises an edge-ground surface. The edge surface 254 can be formed by plasma-treating the edge surface to shape the edge surface so that the edge surface comprises a plasma-treated surface. The shaped substrate edge surfaces can be created by processes such as acid etching via dipping, aerosol-jetting, or other application process, localized thermal process, laser polishing, and plasma can be used to create rounded edge surfaces. Other additive processes such as edge coatings, sol-gel or deliberate edge bumps or oscillations can also be used to achieve the same purpose. Moreover, the edge surface coating process can also be used to encapsulate or protect conductors. An optical index matching coating can facilitate seamless tiling of display tiles. Various edge conductor deposition processes such as printed seed layer then plating, direct printed conductor, laser induced metallization, pen-dispensing and other techniques can be used to form the various electrodes and connectors.

In specific embodiments, the substrate profile can be shaped by using an etching process. After a substrate is formed into tiles and the surface masked as necessary, the edge profile of the display tiles would be rounded, and flaws from the tile forming process reduced by exposure to an appropriate acid dipping solution. Surface masking could be achieved through a printing approach such as screen printing, aerosol jetting, etc. The etching of the tile edges could also be directly achieved via a printing process (e.g. aerosol jetting). In this approach, an acidic, water soluble polymer (e.g. polyacrylic acid) is applied to the desired location of the tile edge followed by exposure to a source of F ions (e.g. ammonium fluoride) which could also be via a printing process. The acidic polymer and the F ions will react to locally form HF to etch the glass and produce a water soluble product (ammonium fluorosilicate) that can be rinsed off. The extent of the etching will be governed by the amount of the reactants applied and time. The use of printing approaches mentioned above could be used along the entire length of the tile edges to produce a uniform profile and provide a process of printing the row electrode connectors and the column electrode connectors. It can also allow for a variable profile, by varying the areas exposed to the acid or amounts of reactants in amounts and/or locations to produce varying profiles. This localized etching of the edge could be further extended to etch grooves for the electronic traces themselves. This localized approach could also be applied to the entire substrate to create grooves for the tile forming process itself and potentially reduce any sharp edges created during tile forming, reducing the amount of additional process to achieve the desired edge profile.

According to one or more embodiments, cost savings can be realized by eliminating glass hole drilling, copper metallization and overburden removal. This reduces the overall process complexity and also can improve the overall yield. Shaping the substrate edge surfaces will also prevent the discontinuity of edge conductor coating by creating smoother corner edges instead of sharp edges. In addition, shaping the substrate edges can also improve the strength of glass to improve the mechanical reliability and minimize the yield loss during tiling of display tiles for form display. Shaping edges by edge coating processes can also facilitate seamless tiling with appropriate index matching material.

In specific embodiments, atmospheric pressure jet plasma could be used for glass edge treatment, using gas such as clean dry air (CDA), or $N_2$ with or without Ar, or adding $H_2$ into CDA or $N_2$ to generate more heat to locally soften glass so that it could re-flow and "heal" cracks on edge surfaces. The glass edge can be made very smooth generating little or no particle shedding. During AP jet plasma glass edge treatment, glass is locally melted and cracks are all "healed" that benefit both significantly less particle generation and improved edge strength. AP jet plasma treated edge can have particle density of less than 10 count/0.1 $mm^2$. Such low particle could benefit device performance and yield. Another benefit of AP jet plasma treated edge is improved edge strength, and in one trial, an atmospheric pressure plasma treated edge had a strength of ranging from 200-230 MPa.

In some embodiments, the substrate edge profile can be shaped using an additive approach. For example, a solution-based coating such as a sol-gel can be used. A thermally or UV-curable sol gel can be applied to the edge of the glass via a dip coating of syringe dispensing method. The surface tension of the material should allow for the formation of a curved edge after curing—similar to a bullnose edge. For a dip coated edge, it is likely that the material would also be deposited on the surfaces adjacent to the edge. This would result in a coating/curvature that would completely cover the corner, thus eliminating the sharp edge.

According to one or more embodiments, the various edge shaping techniques described above, substrate edge strength will be improved and therefore benefit the mechanical reliability. Hot wire heating of the edge can also improve edge strength. Edge coating or flame deposition of $SiO_2$ could also help to fill the cracks to improve the overall mechanical reliability of display tiles.

FIG. 15 shows an embodiment in which a substrate 352 which can be used to provide a display tile as shown in FIGS. 2-4 has an edge surface 354 that is non-linear and comprises a plurality of recessed areas 359 that provide a space for row electrodes 362 or column electrodes (not shown) when display tile substrates 352 are placed in close proximity to each other. The recessed areas 359 provide pockets or gaps that provide an area for the electrodes 362 to reside when display tiles are arranged to provide a tiled display. In one or more embodiments, adjacent edge surfaces may have different profiles or surfaces. Any type of electrode or electrode connector such as the flex circuits described herein can be disposed in the recessed areas.

The shaping the glass-based substrate edge surfaces to make electrodes on the edge surfaces as described above can simplify the processes and save manufacturing cost for manufacturing micro-LEDs. By doing so, the microLED display can be designed with appropriate electrical layout instead of using TGV glass, and the connection between microLEDs on glass surface and IC drives or other components on the back can still be realized by wrapped edge connector electrodes. Moreover, better mechanical reliability can be obtained with edge shaping, and seamless tiling of display tiles can also be achieved with appropriate optical adhesive coating on the edges for both index matching and protection the edge electrodes.

One or more of the row electrodes, the column electrodes, the row electrode connectors and the column electrode connectors can comprise a conductive coating, conductive layer or a conductive ink. Such conductive coatings, conductive layers and conductive inks can be applied by a variety of processes such as electroplating, electroless plating, printing, aerojet printing, thin film deposition, thick film deposition, and ink jet printing. In one or more embodiments, the conductive coatings, layers or inks comprise a conductive metal such as copper or silver, and may be in the form of fine particles such as micrometer-sized particles or nanosized particles. Suitable conductive coating and inks can be obtained from Henkel AG & Co. (http://www.henkel-adhesives.com/conductive-inks-coatings-27433.htm).

Figure 5:
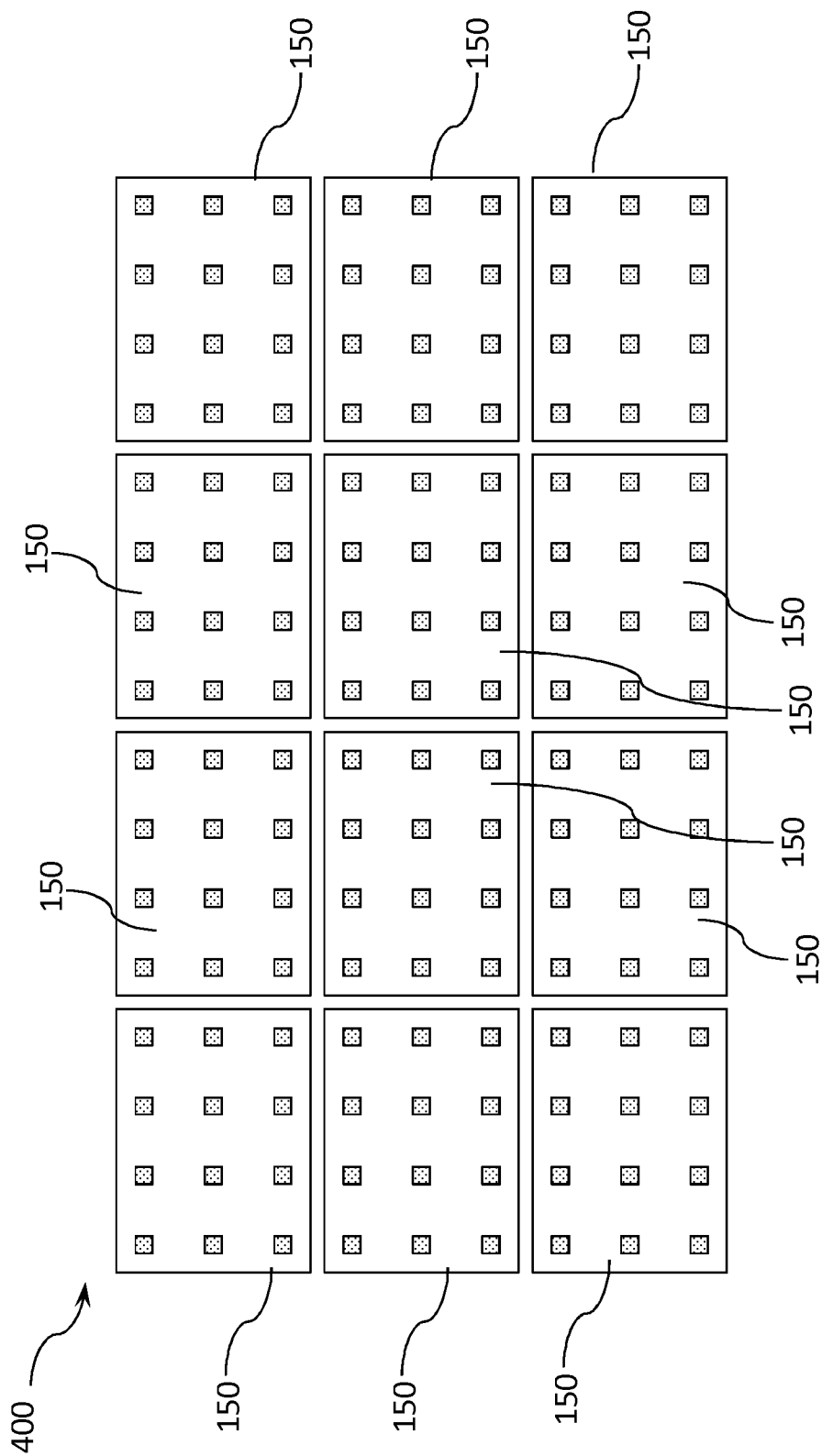
FIG. 5 is a top plan view of an array of display tiles providing a tiled display according to one or more embodiments of the disclosure.

The display tiles described herein can be used to manufacture a tiled display as shown in FIG. 5, which shows a display 400 comprising at least a first display tile 150, for example as shown in FIGS. 2-4. A tiled display can comprise multiple or a plurality of display tiles 150 arranged in an array, where each display tile is in close proximity to an adjacent display tile 150 substrate 152. As used herein, "in close proximity" refers to the substrates that are part of the tiled display are separated so that the pixel pitch (spacing between pixels) across the tile-to-tile seam is ≤150%, ≤120%, ≤110%, ≤105%, or ≤101% of a pixel pitch exiting within the tile. According to embodiments of the disclosure, the edge wrapped electrode connectors allow for the display tiles to be placed in close proximity to maintain the pixel pitch. The display 400 can be any type of display selected from the group consisting of a liquid crystal display (LCD), a light emitting display (LED), a micro LED, an electrophoretic display, an e-paper display, and an organic light emitting display (OLED). In some embodiments, the display comprises a micro LED and the pixel elements are located within 500 micrometers, 400 micrometers, 300 micrometers, 200 micrometers, or 100 micrometers from the edge surface of each display tile, and methods can be utilized where the pixel elements are within 500 micrometers or 200 micrometers from the edge surface.

Another aspect of the disclosure pertains to methods of manufacturing display tiles as shown in FIGS. 2-4 above. The method comprises placing at least one driver on a first substrate that activates pixel elements on a first surface of the first substrate with the driver on a second surface opposite the first surface. The method also comprises placing a connector on an edge surface and extending to the first surface and the second surface, the edge surface defining an outer perimeter. The method can be varied to provide various configurations as discussed above with respect to the display tiles described herein.

In an embodiment, the first surface comprises an array of pixel elements arranged in a plurality of rows of pixel elements and a plurality of columns of pixel elements, the method further comprising connecting each row of pixel elements with a row electrode; and electrically connecting each column of pixel elements with a column electrode, wherein the at least one driver comprises a row driver that activates the plurality of rows of pixel elements and a column driver that activates the plurality of columns of pixel elements, the row driver and the column driver located opposite the first surface.

In an embodiment, the method further comprises electrically connecting each row electrode, each row of pixel elements and the row driver with a row electrode connector wrapped around the edge surface; and electrically connecting each column electrode, each column of pixel elements and the column driver with a connector wrapped around the edge surface In some embodiments of the method, each row electrode connector and each column electrode connector comprises a flex circuit including a flexible polymeric film and a conductor, the method further comprising adhering the flex circuit to the edge surface. The flex circuit can further comprise an adhesive, and adhering comprises applying pressure to the flex circuit to adhere the flex circuit to the edge surface. The method can include utilizing the various thicknesses and material described above. In some embodiments, the method includes electrically connecting each row electrode to a row electrode connector by applying a row conductive coating in contact with the row electrode connector and the row electrode and electrically connecting each column electrode to a column electrode connector by applying a conductive coating in contact column electrode conductor and the column electrode.

An embodiment of the method includes stacking of a plurality of substrates to provide a stack, each of the plurality of substrates having an edge surface, and adhering the flex circuit to each of the edge surfaces of each of the plurality of substrates. In some embodiments, the second surface is on the flex circuit, and further comprising wrapping the flex circuit around a standoff disposed opposed the first surface.

Some method embodiments further comprise shaping the edge surface so that a first corner is formed between the edge surface and the first surface and a second corner is formed between the edge surface and the second surface, and the first corner and the second corner do not comprise a 90 degree angle or undercut angle. In some embodiments, the method comprises forming a plurality of column electrode connectors and forming a plurality of row electrode connectors comprises forming a plurality of layers of conductive material. Some embodiments comprise forming a non-linear edge surface comprising a plurality of recessed areas. Such embodiments may include disposing at least one of the row electrode connectors and at least one of the column electrode connectors within a recessed area. In some embodiments, forming the row electrode connectors and column electrode connectors may be formed by a method selected from printing using conductive ink, vacuum depositing the conductive coating, solution coating the conductive coating, or laminating the conductive coating.

Figure 17:
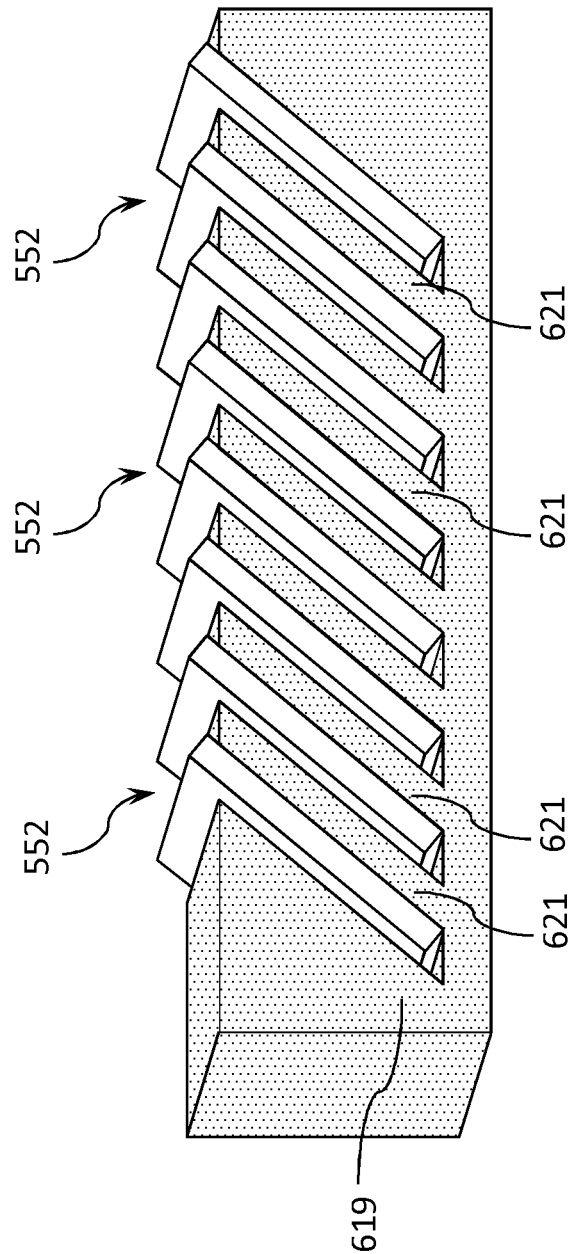
FIG. 17 is a side perspective view showing a sample holder for processing substrates to make a plurality of display tiles according to one or more embodiments of the disclosure.

Another aspect of the disclosure pertains to methods for mass producing display tiles. Referring now to FIGS. 16A-B and 17, one embodiment, a method of forming a plurality of display tiles comprises stacking a plurality of substrates 552 to provide a stack, each of the plurality of substrates having a first surface 555, a second surface 557 opposite the first surface 555 and an edge surface 554 between the first surface 555 and the second surface 557, the edge surface 554 defining an outer perimeter and arranging the stack at an angle with respect to a horizontal surface to expose the edge surface. Arranging the stack at an angle with respect to a horizontal surface can include standing the stack on one edge so that the stack is perpendicular to the horizontal surface. In some embodiments, arranging the stack at an angle includes tilting the stack in a first direction as shown in FIG. 16A at an angle (e.g. 45-85 degrees) with respect to a horizontal surface 510 to expose the edge surfaces 554. The method further comprises depositing conductive material 513 on the edge surface 554 the first surface 555 and the second surface 557 of each of the substrates 552 in the stack to form a plurality of row electrode connectors and a plurality of column electrode connectors. It will be understood that deposition on the first surface 555 may occur in a first step when the stack is tilted in a first direction and then deposition on the second surface 557 may occur when the stack is tilted in a second direction. The method according to some embodiments includes an array of pixel elements arranged in a plurality of rows of pixel elements on the first surface of each of the plurality of substrates, such as the rows shown in FIGS. 2-4, and electrically connecting an array of pixel elements arranged in a plurality of rows of pixel elements and a plurality of columns of pixel elements so that there are individual rows of pixel elements on the first surface of each of the plurality of substrates, the individual rows of pixel elements connected with individual row electrodes and individual row electrode connectors, such as shown in FIGS. 2-4. The method of some embodiments further comprises electrically connecting individual columns of pixel elements and a single column electrode connector with a column electrode, such as the column electrodes shown in FIGS. 2-4. The method further comprises placing at least one driver that activates the pixel elements on a second surface opposite the first surface of each of the plurality of substrates, for example, in a configuration as shown in FIGS. 2-4, The method shown in FIGS. 16A-B and 17 in some embodiments further comprises tilting the stack in a second direction as shown in FIG. 16B at a second angle (e.g. 45-85 degrees) with respect to a horizontal surface 510 and depositing the conductive material 513. Thus, as shown in FIG. 16A, the plurality of substrates in a stack are shown tilted to the left on an edge surface, and a coating applicator 517 applies conductive coating to the edge surfaces 554 of the substrates. A suitable applicator can be a printer or an aerosol jet or a pen dispenser. Dispensing of conductive material can be carried out with the programmed path line to apply on desired region with seed layer or an appropriate design fixture to rotate the substrate for dispensing process step. In FIG. 16B, to aid in the conductive material 513 covering the second surface 557 to form a conductor that wraps around the edge surface 554 from the first surface 555 to the second surface 557, the substrates 552 are tilted to the right at the second angle with respect to the horizontal surface 510, and then the applicator 517 applies conductive coating to the substrates 552 in the stack. This process enables the formation of a plurality of row electrode connectors and a plurality of column electrode connectors that wrap around the edge surface and contact the first surface and the second surface of each of the plurality of substrates. As shown in FIGS. 16A and 17, in some embodiments the substrates 552 are placed in a holder 519 to hold the substrates at an angle with respect to horizontal surface 510. FIG. 17 shows an alternative version of a sample holder 619 having separators 621 that keep the substrates spaced apart and in a stacked relationship for forming conductive coatings as shown in FIG. 16A. Note that in the sample holder 619 of FIG. 17, the substrates would have to be removed and placed back in the sample holder 619 to form a conductive coating that wraps around the edge surface 554 to the first surface 555 and the second surface 557 of the substrates 552.

Manufacture of a plurality of row electrode connectors and a plurality of column electrode connectors that wrap around the edge surface and contact the first surface and the second surface of each of the plurality of substrates can utilize a variety of methods. There are multiple methods that can be used to fabricate electrodes around a substrate edge surface according to one or more embodiments. These are described in more detail below.

In one embodiment, forming a printed seed layer and plating (e.g., electroplating or electroless plating) can be utilized to manufacture electrodes that wrap around the edge surface. Patterning a polymer-based paste with silver (or other conductive species) nanoparticles made by followed by electroless plating (or electroplating) plating copper can be used obtain copper lines to manufacture electrodes. A pattern can be created manually using a mask that exposes the perimeter of the substrate on the order of 2 mm, 4 mm or 10 mm. Spin coating, for example, at 2000 rpm for 60 seconds can be used to apply a paste, which can be cured by ultraviolet light and/or by thermal cure, for example at 180° C. for 100 minutes. Electroless deposition of copper can then be performed at an appropriate time and temperature, e.g. 50° C. for 30 minutes or 60 minutes to provide a suitable thickness, e.g., 3 micrometers or 5-6 micrometers. Electrodes manufactured in this manner had a measured resistivity is 0.3-0.5Ω with 1-3 centimeters in length. Other methods can likewise produce edge connector resistivities of ≤10, ≤5, ≤2, ≤1, ≤0.5, ≤0.2, ≤0.1Ω for a ≤10 mm length as formed around the edge of the substrate connecting the first and second surfaces.

Figure 18:
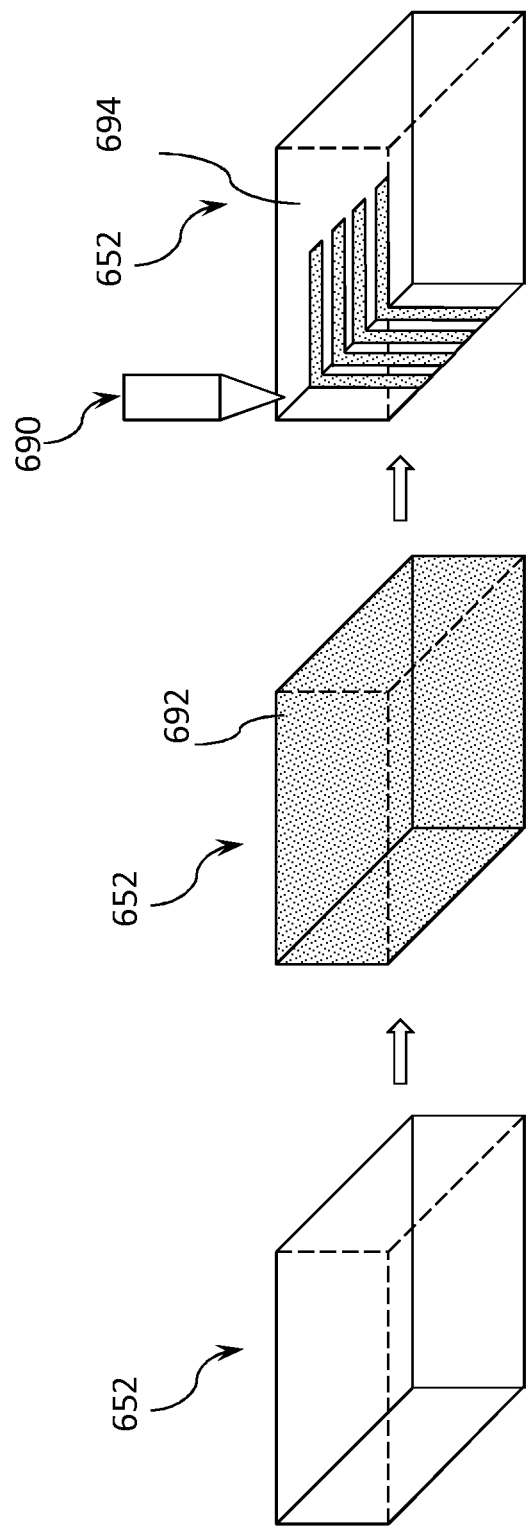
FIGS. 18A-C show a substrate being processed to manufacture a display tile according to one or more embodiments of the disclosure.

Another method that can be used to manufacture electrodes that wrap around the edge surfaces of substrates is laser induced metallization. This method is somewhat similar to the deposition of seed layer following by plating; however, the difference in this technique is the use of laser 690 to activate a seed (catalyst) layer 692 for following metallization. A simplified schematic in FIGS. 18A-C illustrates such a process. Using this technique, a pattering region 694 can be three-dimensional with arbitrary surface features so that a pattern to manufacture an electrode can be completed in one step rather than multiple steps when compared with a two-dimensional coating process. The process can be performed with a programmed path line to apply the laser 690 on a designed region for pattering. Instead of moving the laser 690 with respect to the substrate 652, an appropriate design fixture can be used to rotate the substrate 652 during a laser pattering step. A sample made using this technique to manufacture 80 micrometer wide Cu lines could be used to manufacture wrap around electrodes.

In one or more embodiments, metal nanoparticles in photoresist can be used to manufacture electrodes by mixing photoresist with metal nanoparticles for conductor (e.g., Cu) seed layer patterning. Photoresist has light-sensitive property. It can be formed by pattern coating on glass surface by exposure under ultraviolet light. A thin layer of silver nanoparticle coating can be employed as a catalyst which enables deposition of a copper seed layer on a substrate surface by plating such as electroless plating. Atmospheric pressure plasma can be utilized to remove photoresist selectively by a mask. A wet electroless deposition copper process can be conducted after defining a silver nanoparticle coating on a substrate front, back and edge surfaces, followed by electroplating thicker copper on the seed layer.

In one or more embodiments, another method that could be used to manufacture wrap around electrodes is laser 3D pattering by coating glass sheet with a conductor such as copper or silver including whole edge surface and then utilize 3D laser to remove and define the line pattern of the conductive layer. By doing so, a wet process of copper electroless plating could be used to ensure the conductor can be deposited on not only both two surfaces but also whole edge surface. In one embodiment, a silane modification method with Pd/Sn catalyst can be utilized to activate glass surface prior conductor electroless plating. Using a series of wet processes, a substrate is immersed in silane, then catalysis and activation solutions, and then through electroless plating of the conductor. This way, the entire substrate would be coated with a uniform conductor seed layer (e.g., about 100-200 nanometers in thickness). A 3D laser can be utilized to perform three dimensional patterning similar to the method shown in FIGS. 18A-C. Conductor film at a non-defined area can be removed by laser. A 3D laser is able to scan and record the profile of 3D subjects. Therefore, it can be used for patterning a conductor film across a substrate edge surface to manufacture electrodes that wrap around edge surfaces of substrates.

Thus, manufacturing of the plurality of row electrode connectors and the manufacturing of the plurality of column electrode connectors on each of the plurality of substrates can comprise masking each of the plurality of substrates to form exposed areas on the first surface, the second surface and the edge surface and depositing conductive material on the exposed areas on each of the plurality of substrates to form a pattern of row electrode connectors and column electrode connectors. Depositing can comprise depositing a paste containing silver particles and plating copper on the paste containing silver particles. In one or more embodiments, manufacturing the plurality of row electrode connectors and manufacturing the plurality of column electrode connectors on each of the plurality of substrates can comprise depositing the conductive material on each of the plurality of substrates, plating the conductive material with copper, and irradiating the substrate with a laser beam to form a pattern of row electrode connectors and column electrode connectors. The irradiating can occur before or after copper plating. In some embodiments, forming the plurality of row electrode connectors and column electrode connectors on each of the plurality of substrates comprises a process selected from the group consisting of one or more of depositing conductive material on the substrate with an aerosol jet to form a pattern of row electrode connectors and column electrode connectors, an additive process such as printing conductive material, and a subtractive process such as etching. In specific embodiments, forming the plurality of row electrode connectors and column electrode connectors on each of the plurality of substrates comprises depositing conductive material on each of the plurality of the substrates with an aerosol jet to form a pattern of row electrode connectors and column electrode connectors. During such forming, the edge surface of each of the plurality of substrates is selected from a curved edge surface, an edge-ground edge surface, a plasma treated edge surface and a polygonal edge surface that comprises angles greater than 90 degrees.

Figure 19:
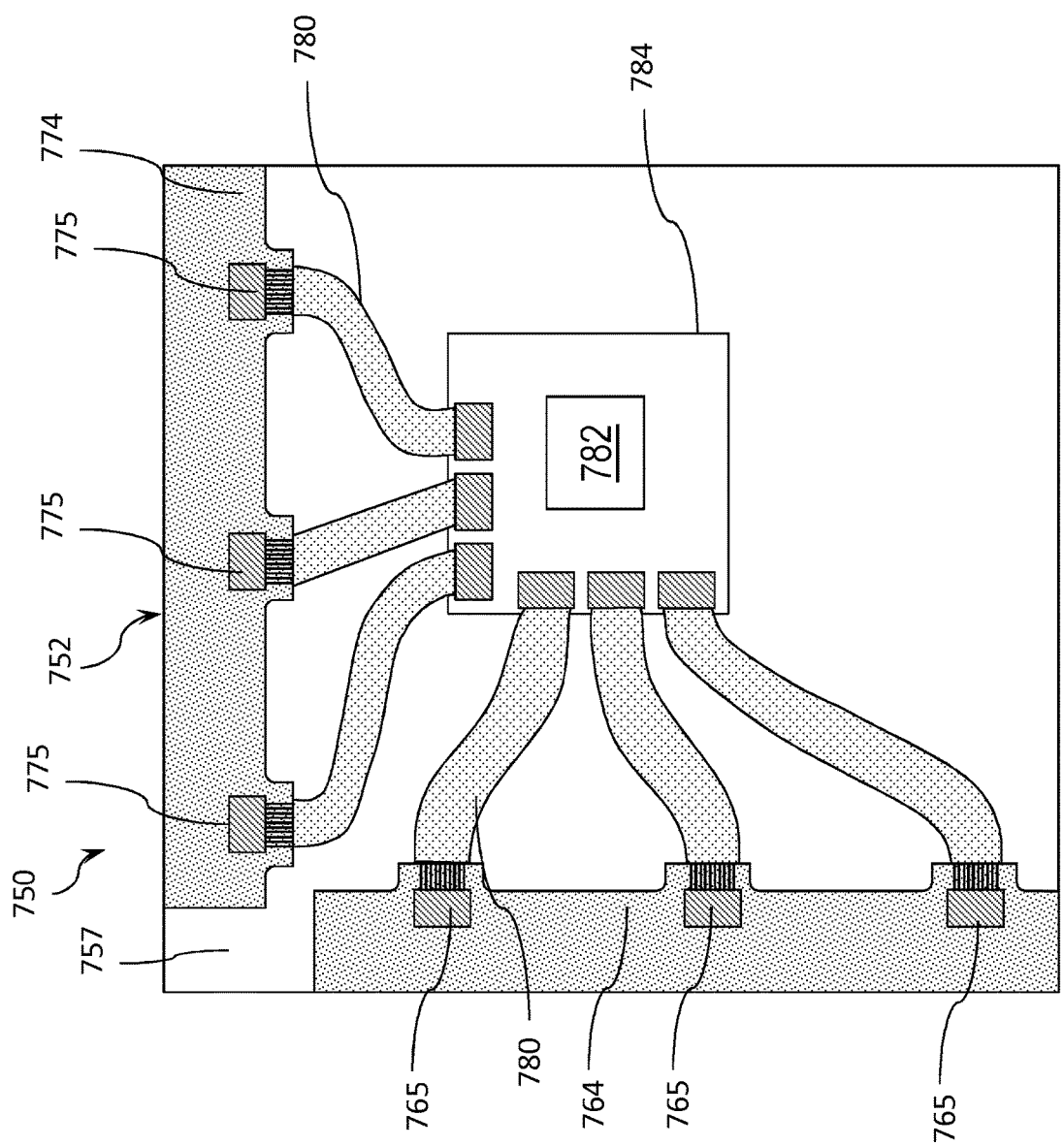
FIG. 19 is a bottom plan view of a display tile connected to a central processing unit according to one or more embodiments of the disclosure.

FIG. 19 shows an embodiment of a display tile 750 that can be used to manufacture a tiled display. A substrate 752 has row drivers 765 and column drivers 775 on the second surface 757 that are connected by row electrode connectors 764 and column driver connectors 774 to pixels on the opposite side of the substrate 752 (as shown in FIGS. 2-4). Ribbon cables 780 connect the row drivers 765 and the column drivers 775 to a CPU 782 on a printed circuit board 784. Generally, the CPU can control an image displayed on a display tile by controlling the voltages supplied to each row driver and column driver in a manner to provide an image on the display tile. The individual pixel elements can be addressed or activated by a unique row/column combination controlled by the CPU 782 utilizing known technology. In some embodiments, the CPU 782 is configured to send the value of each pixel element to its respective row and column driver with those drivers actually providing the appropriate voltage. In a specific embodiment, row drivers 765 are on row electrode connectors 764 in the form of a flex circuit as described above along one edge and column drivers 775 are on column driver connectors 774 in the form of a flex circuit along an adjacent edge of the substrate 752. The row drivers and column drivers can be soldered to the flex circuit. The row drivers together can have a pin for each row of pixels and the row electrode connector provides a conductor for each of those pins to connect to their respective rows of pixel, and the columns can be configured similarly.

It will be appreciated that the various disclosed embodiments may involve particular features, elements or steps that are described in connection with that particular embodiment. It will also be appreciated that a particular feature, element or step, although described in relation to one particular embodiment, may be interchanged or combined with alternate embodiments in various non-illustrated combinations or permutations.

It is also to be understood that, as used herein the terms "the," "a," or "an," mean "at least one," and should not be limited to "only one" unless explicitly indicated to the contrary. Thus, for example, reference to "a light source" includes examples having two or more such light sources unless the context clearly indicates otherwise. Likewise, a "plurality" or an "array" is intended to denote "more than one." As such, a "plurality of light scattering features" includes two or more such features, such as three or more such features, etc., and an "array of microstructures" includes two or more such microstructures, such as three or more such microstructures, and so on.

Ranges can be expressed herein as from "about" one particular value, and/or to "about" another particular value. When such a range is expressed, examples include from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

The terms "substantial," "substantially," and variations thereof as used herein are intended to note that a described feature is equal or approximately equal to a value or description. For example, a "substantially planar" surface is intended to denote a surface that is planar or approximately planar.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

Various modifications and variations can be made to the materials, methods, and articles described herein. Other aspects of the materials, methods, and articles described herein will be apparent from consideration of the specification and practice of the materials, methods, and articles disclosed herein. It is intended that the specification and examples be considered as exemplary. It will be apparent to those skilled in the art that various modifications and variations can be made without departing from the spirit or scope of the disclosure.

What is claimed is:

1. A display tile comprising:
   a first substrate comprising a first surface, a second surface opposite the first surface and an edge surface between the first surface and the second surface, the edge surface defining an outer perimeter;
   the first surface comprising an array of pixel elements arranged in a plurality of rows of pixel elements and a plurality of columns of pixel elements, each row of pixel elements connected by a row electrode and each column of pixel elements connected by a column electrode;
   a row driver that activates the rows of pixel elements and a column driver that activates the columns of pixel elements, the row and the column drivers located opposite the first surface;
   a plurality of row electrode connectors, each row electrode connector wrapped around the edge surface and electrically connecting a row electrode, a row of pixel elements and the row driver; and
   a plurality of column electrode connectors, each column electrode connector wrapped around the edge surface and electrically connecting a column electrode, a columns of pixel elements and the column driver,
   wherein when any edge surface of the display tile is placed in close proximity to an adjacent display tile of a tile display, a pixel pitch across a tile-to-tile seam of the tile display is approximately matched to that within the display tile.

2. The display tile of claim 1, wherein the display tile is free of a bezel around the outer perimeter.

3. The display tile of claim 1, wherein each row electrode connector and each column electrode connector comprises a conductive coating, conductive layer or conductive ink deposited by electroplating, electroless plating, printing, aerojet printing, deposition, or ink jet printing.

4. The display tile of claim 3, wherein the conductor is selected from copper and silver.

5. The display tile of claim 3, wherein the row and the column drivers are on the second surface of the first substrate.

6. The display tile of claim 3, wherein the second surface is on a second substrate.

7. The display tile of claim 6, wherein the second substrate is in a stacked arrangement with the first substrate.

8. The display tile of claim 3, wherein the first substrate comprises a glass-based substrate.

9. The display of claim 8, wherein a thickness $d_1$ of the glass-based substrate ranges from about 0.1 mm to about 3 mm.

10. The display tile of claim 3, wherein the conductive coating, conductive layer, or conductive ink comprises metal nanoparticles.

11. The display tile of claim 1, wherein the second surface is on the first substrate and the edge surface is shaped so that a first corner is formed between the edge surface and the first surface and a second corner is formed between the edge surface and the second surface, and the first corner and the second corner do not include a 90 degree angle or undercut angle.

12. The display tile of claim 11, wherein the edge surface is comprises a curved cross-section.

13. The display tile of claim 11, wherein the edge surface comprises a polygonal cross-section.

14. The display tile of claim 11, wherein the edge surface comprises an etched surface.

15. The display tile of claim 11, where the edge surface comprises an edge-ground surface.

16. The display tile of claim 11, wherein the edge surface comprises a plasma-treated surface.

17. The display tile of claim 11, wherein the edge surface is non-linear and comprises a plurality of recessed areas.

18. The display tile of claim 17, wherein at least one of the row electrode connectors and at least one of the column electrode connectors are disposed within a recessed area.

19. A display comprising a first display tile as defined by claim 1.

20. The display tile of claim 19, wherein the display comprises a micro LED and the pixel elements are located within 500 micrometers from the edge surface.

21. A display comprising the second display tile as defined by claim 1 in close proximity to the first substrate.

22. The display of claim 21, wherein the display is selected from the group consisting of a liquid crystal display (LCD), a light emitting display (LED), a micro LED, electrophoretic, e-paper, and an organic light emitting display (OLED).

* * * * *